United States Patent
Li et al.

(10) Patent No.: US 9,324,873 B2
(45) Date of Patent: Apr. 26, 2016

(54) FABRICATING METHOD OF THIN FILM TRANSISTOR, THIN FILM TRANSISTOR AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jing Li, Beijing (CN); Zhenyu Xie, Beijing (CN); Xu Chen, Beijing (CN); Wenyu Zhang, Beijing (CN); Da Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/421,931
(22) PCT Filed: Apr. 25, 2014
(86) PCT No.: PCT/CN2014/076195
§ 371 (c)(1),
(2) Date: Feb. 16, 2015
(87) PCT Pub. No.: WO2015/100887
PCT Pub. Date: Jul. 9, 2015

(65) Prior Publication Data
US 2016/0035901 A1   Feb. 4, 2016

(30) Foreign Application Priority Data
Dec. 30, 2013 (CN) .......................... 2013 1 0745564

(51) Int. Cl.
H01L 21/00 (2006.01)
H01L 21/20 (2006.01)
(Continued)

(52) U.S. Cl.
CPC ...... *H01L 29/78675* (2013.01); *H01L 21/0217* (2013.01); *H01L 21/02532* (2013.01);
(Continued)

(58) Field of Classification Search
CPC ..................... H01L 21/0217; H01L 21/02532; H01L 21/02592; H01L 21/02595; H01L 21/02672; H01L 21/31111; H01L 27/1222; H01L 29/78603; H01L 29/78675; H01L 29/66757
USPC ............ 438/149, 158, 166, 486, 487; 257/49, 257/51, 57, 66, E21.131, E21.133, 257/E21.379, E21.426, E27.112, E29.021, 257/E29.051, E29.286
See application file for complete search history.

(56) References Cited

U.S. PATENT DOCUMENTS 5,213,991 A * 5/1993 Inokawa ........... H01L 21/76877
257/E21.131
5,882,958 A * 3/1999 Wanlass ............ H01L 29/66651
257/E21.133

(Continued)

FOREIGN PATENT DOCUMENTS

CN 101834123 A 9/2010
CN 101834124 A 9/2010
(Continued)

OTHER PUBLICATIONS

International Search Report mailed Sep. 29, 2014; PCT/CN2014/076195.
(Continued)

*Primary Examiner* — Dao H Nguyen
(74) *Attorney, Agent, or Firm* — Ladas & Parry LLP

(57) ABSTRACT

Embodiments of the invention provide a fabricating method a thin film transistor, a thin film transistor and a display panel, so as to improve carrier mobility in the polycrystalline silicon. The fabricating method a thin film transistor comprises following M1, depositing an inducing layer on a substrate; M2, etching a recess in the inducing layer by an etching process, the recess having an edge with a prescribed shape; M3, depositing an amorphous silicon layer in the recess having an edge with a prescribed shape, and inducing the amorphous silicon layer to form a polycrystalline silicon layer by crystallization method, polycrystalline silicon grains in the polycrystalline silicon layer arranging in a direction vertical to the edge of the recess by the limitation of the edge of the recess, and the polycrystalline silicone layer and the inducing layer together forming a semiconductor layer; and M4, forming a gate insulating layer, a gate, a passivation layer and a source and a drain connecting with the semiconductor layer sequentially on the semiconductor layer.

20 Claims, 2 Drawing Sheets

(51) Int. Cl.
*H01L 27/092* (2006.01)
*H01L 29/786* (2006.01)
*H01L 21/02* (2006.01)
*H01L 29/66* (2006.01)
*H01L 21/311* (2006.01)

(52) U.S. Cl.
CPC .... *H01L21/02592* (2013.01); *H01L 21/02672* (2013.01); *H01L 21/31111* (2013.01); *H01L 29/66757* (2013.01); *H01L 29/78603* (2013.01)

(56) References Cited

U.S. PATENT DOCUMENTS

| | | | | |
|---|---|---|---|---|
| 5,970,367 | A * | 10/1999 | Wanlass | H01L 29/66772 257/E21.132 |
| 6,376,339 | B2 * | 4/2002 | Linthicum | C30B 25/02 257/E21.125 |
| 6,420,764 | B1 * | 7/2002 | Blanchard | H01L 21/823807 257/377 |
| 7,749,817 | B2 * | 7/2010 | Kermarec | H01L 21/76924 438/149 |
| 2002/0192956 | A1 * | 12/2002 | Kizilyalli | H01L 21/2026 438/689 |
| 2009/0155988 | A1 | 6/2009 | Peng et al. | |
| 2013/0273724 | A1 | 10/2013 | Joo et al. | |
| 2014/0070217 | A1 | 3/2014 | Liu et al. | |

FOREIGN PATENT DOCUMENTS

| | | |
|---|---|---|
| CN | 102842620 A | 12/2012 |
| CN | 102956499 A | 3/2013 |
| CN | 103700698 A | 4/2014 |
| KR | 1020070043357 A | 4/2007 |

OTHER PUBLICATIONS

Written Opinion of the International Searching Authority mailed Sep. 29, 2014; PCT/CN2014/076195.

First Chinese Office Action dated Nov. 26, 2015; Appln No. 201310745564.3.

* cited by examiner

FABRICATING METHOD OF THIN FILM TRANSISTOR, THIN FILM TRANSISTOR AND DISPLAY PANEL

FIELD

The invention relates to liquid crystal display field, in particular relates to a fabricating method of a thin film transistor, a thin film transistor and a display panel.

BACKGROUND

Recently, with the development of the technology of polycrystalline silicon thin film transistor (TFT), there are more applications of the TFT, and the polycrystalline silicon thin film transistor is considered to be an ideal alternative of an amorphous silicon thin film transistor. In comparison with the amorphous silicon thin film transistor, the polycrystalline silicon thin film transistor has the characteristics of high mobility, high integration, high resolution and so on, thus providing a brighter and finer image.

A thin film transistor known by inventors is usually fabricated by a following method. Referring to FIG. 1, the method comprises: step S1, forming a first passivation layer on a substrate; step S2, depositing an amorphous silicon layer on the first passivation layer, and inducing the amorphous silicon layer so as to form a polycrystalline silicon active layer; step S3, forming a gate insulating layer on the polycrystalline silicon active layer by a patterning process; step S4, forming a gate in a central part above the gate insulating layer; step S5, forming a second passivation layer on the gate insulating layer and the gate; and step S6, forming a source/drain metal layer on the second passivation layer, and forming a source/drain by a patterning process.

The polycrystalline silicon thin film transistors fabricated by above method are formed usually by inducing the amorphous silicon using a crystallization method. In the process of inducing the amorphous silicon to form the polycrystalline silicon, the amorphous silicon crystallizes spontaneously and slowly to form grains along an energy inducing direction. These grains formed in the spontaneous conditions are small in size with random shapes and arrangements, causing low carrier mobility within the polycrystalline silicon.

SUMMARY OF THE INVENTION

Embodiments of the invention provide a fabricating method of a thin film transistor, a thin film transistor and a display panel, in order to improve carrier mobility in the polycrystalline silicon.

An embodiment of the invention provides a fabricating method of a thin film transistor comprising following steps: M1, depositing an inducing layer on a substrate; M2, etching a recess in the inducing layer by an etching process, the recess having an edge with a prescribed shape; M3, depositing an amorphous silicon layer in the recess having an edge with a prescribed shape, and inducing the amorphous silicon layer to form a polycrystalline silicon layer by crystallization method, polycrystalline silicon grains in the polycrystalline silicon layer arranging in a direction vertical to the edge of the recess by the limitation of the edge of the recess, and the polycrystalline silicone layer and the inducing layer together forming a semiconductor layer; and M4, forming a gate insulating layer, a gate, a passivation layer and a source and a drain connecting with the semiconductor layer sequentially on the semiconductor layer.

For example, the step M2 comprises: etching a recess in the inducing layer by an etching process, and a plurality of convex portions are formed inwards in a direction vertical to the edge of the recess.

For example, the plurality of convex portions are serrated.

For example, the step M1 comprises: depositing dense inducing sub-layer and sparse inducing sub-layer alternatively so as to form the inducing layer composed of the dense inducing sub-layer and the sparse inducing sub-layer on the substrate; and the step M2 comprises: etching the inducing layer so that the dense inducing sub-layer and the sparse inducing sub-layer deposited alternatively form a plurality of serrated convex portions correspondingly.

For example, the inducing layer is made of a material of silicon nitride.

For example, the polycrystalline silicon layer has an upper surface flush with an upper surface of the inducing layer.

For example, the semiconductor layer has a thickness of 100 nm-200 nm.

For example, the step of forming a gate insulating layer, a gate, a passivation layer and a source and a drain connecting with the semiconductor layer sequentially on the semiconductor layer comprises: forming a gate insulating layer and a gate metal layer on the semiconductor layer sequentially, forming pattern of the gate in the gate metal layer by a patterning process; forming a passivation layer on the gate insulating layer and the gate, and forming through holes for the source and the drain on the gate insulating layer and the passivation layer by a patterning process; forming a source/drain metal layer on the passivation layer, and photoetching the source/drain metal layer by a patterning process so as to form the source and the drain, the source and drain connect with the semiconductor layer via through holes passing through the gate insulating layer and the passivation layer.

Embodiments of the invention provide a thin film transistor fabricated by a method according to the embodiments of the invention.

Embodiments of the invention provide a display panel comprising a thin film transistor according to the embodiments of the invention.

Embodiments of the invention provide a fabricating method of a thin film transistor, a thin film transistor and a display panel. In the thin film transistor fabricated by the method according to the embodiments of the invention, since the etched recess in the inducing layer deposited on the substrate has an edge of a prescribed shape, and the amorphous silicon layer is deposited in the recess with a prescribed shape, in case that the amorphous silicon is formed into the poly crystal line silicon induced by the crystallization inducing method in the recess with a prescribed shape, the polycrystalline silicon grains are arranged inwards in the direction vertical to the edge of the recess, which can reduce grain boundary defects significantly, thus improving carrier mobility in the polycrystalline silicon. The method is simple and easy to implement, and the stability of the thin film transistor fabricated by this method is greatly improved.

BRIEF DESCRIPTION OF THE DRAWINGS

To illustrate technical solutions of the embodiments of the invention or prior art more clearly, the drawings used in the description of the embodiments or prior art are simply introduced hereinafter. Apparently, the drawings described below are just a part of embodiments according to technical solutions of the present disclosure. For those skilled in the art, other drawings can be obtained according to these drawings without creative efforts.

DESCRIPTION OF THE EMBODIMENTS

The technical solution of the embodiments of the present disclosure will be described clearly and fully in connection with the drawings of the embodiments of the present disclosure. It is obvious that the described embodiments are just a part but not all of the embodiments of the present disclosure. Based on the described embodiments of the present disclosure, those skilled in the art can obtain all other embodiment without any inventive work, which all fall into the scope of the claimed invention.

Unless otherwise defined, technical terms or scientific terms used herein shall have a common meaning known by those skilled in the art of the present disclosure. Words and expressions such as "first", "second" and the like used in the description and claims of the patent application of the present disclosure do not denote any sequence, quantity or significance, but distinguish different components. Likewise, words such as "a", "an" and the like do not denote quantitative restrictions, but denote the presence of at least one. Words such as "connected", "connecting" and the like are not restricted to physical or mechanical connections, but may include electrical connections, regardless of direct or indirect connections. Words such as "up", "below", "left", "right" and so on are only used to denote the relative positional relationship. Upon the absolute position of the described object changes, the relative positional relationship change correspondingly.

The fabricating method a thin film transistor, the thin film transistor and the display panel of the embodiments of the present invention will be further described in detail as follows in conjunction with the drawings.

Figure 1:
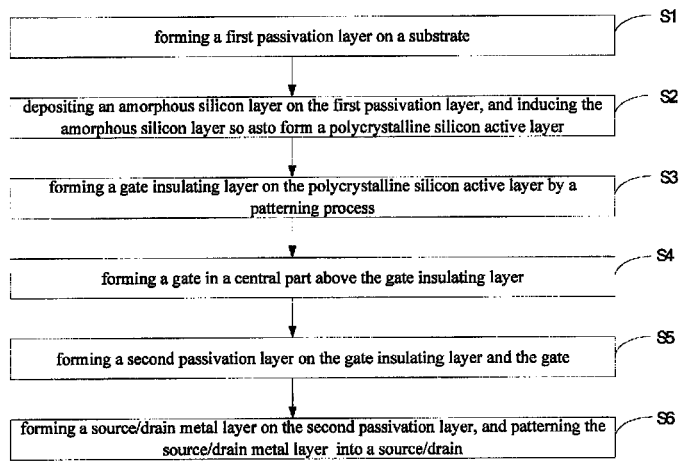
FIG. 1 is a flow chart of a conventional fabricating method of a thin film transistor.
Figure 2:
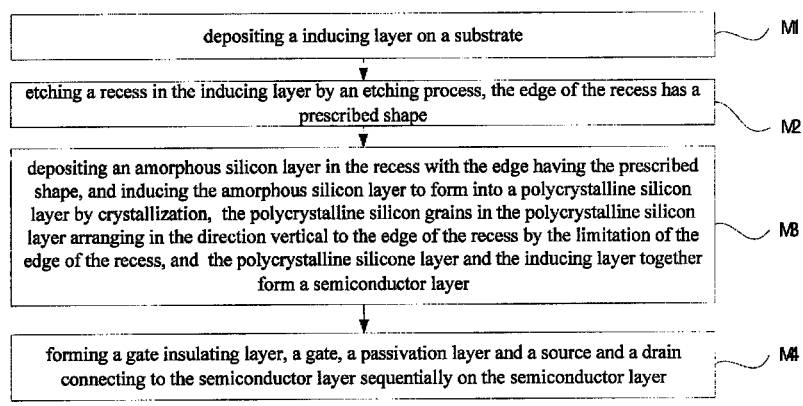
FIG. 2 is a flow chart of a fabricating method of a thin film transistor according to an embodiment of the invention.

FIG. 2 is a flow chart of a fabricating method of the thin film transistor according to an embodiment of the invention. Referring to FIG. 2, the fabricating method according to an embodiment of the invention comprises steps as follows.

M1: an inducing layer is deposited on a substrate.

In this step, for example, the inducing layer can be deposited by plasma chemistry vapor deposition process. The inducing layer is made of a material of silicon nitride, that is, the inducing layer is silicon nitride thin film layer. A recess for placing polycrystalline silicon layer therein can be set in the inducing layer so as to provide a prescribed area for the polycrystalline silicon grains to grow.

M2: the recess can be etched in the inducing layer by an etching process, and the edge of the recess has a prescribed shape.

In this step, for example, the recess can be formed by the etching process in the inducing layer. For example, the recess may have a main structure of cuboid. While forming the recess by the etching process, the edge of the recess having a prescribed shape is also etched. For example, by the etching process, while etching the recess in the inducing layer, a plurality of convex portions are also formed inwards in a direction vertical to the edge of the recess. The prescribed shape comprises, for example, a plurality of convex portions formed inwards in a horizontal direction vertical to the edge of the recess. For example, the recess comprises four standing side walls and one bottom, the four standing side walls and one bottom define a space for containing the polycrystalline silicon grains. The convex portions are formed on all four standing side walls. The convex portions at the edge of the recess offer a growth direction to the polycrystalline silicon grains, enabling the polycrystalline silicon grains set in the recess to grow along the prescribed direction of the edge of the recess under the induction of the energy.

For example, the convex portions can be serrated, so as to confine the lateral growth direction of the polycrystalline silicon grains better. It is understood that the convex portions are used for offering a growth direction for polycrystalline silicon grains, so that polycrystalline silicon grains can grow along the prescribed direction. Therefore, the shape of the convex portion is not limited to the serrated shape according to the embodiment of the invention, for example, when a single convex portion has arc-shape or a bow shape, the shape of the pluralities of convex portions is wavy.

M3: an amorphous silicon layer is deposited in the recess having the prescribed shape, and a polycrystalline silicon layer is formed by inducing the amorphous silicon layer using a crystallization method. The polycrystalline silicon grains in the polycrystalline silicon layer are arranged in the direction vertical to the edge of the recess due to the confinement of the edge of the recess. The polycrystalline silicon layer and the inducing layer form a semiconductor layer together.

Figure 3:
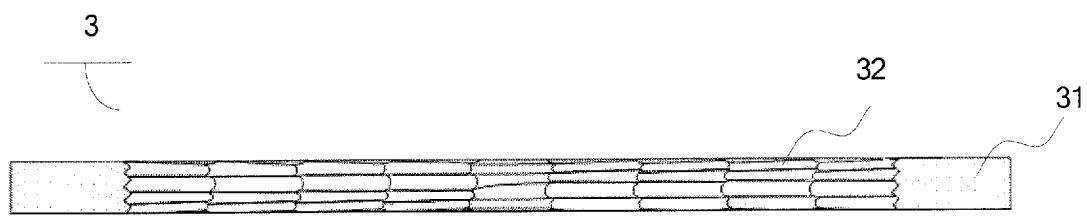
FIG. 3 is a structural schematic view of a semiconductor layer of a thin film transistor according to an embodiment of the invention.

In this step, the crystallization method can be solid phase crystallization method, or laser crystallization method. The energy is provided from any side of the horizontal direction of the recess for inducing the recess, promoting the amorphous silicon located within the recess to form crystal nuclei gradually along the prescribed shape of the edge of the recess. The crystal nuclei continue to grow and contact with each other to form polycrystalline silicon grains, which integrated into a polycrystalline silicon layer. Referring to FIG. 3, the polycrystalline silicon grains in the polycrystalline silicon layer 32 formed in the recess are distributed in a lateral direction with respect to the level of the inducing layer 31. As the polycrystalline silicon grains grow laterally along the inducing direction of the energy in the horizontal direction of the recess, the formed polycrystalline silicon grains are also distributed in the lateral direction of recess, so that the polycrystalline silicon grains obtained in this growth method have large size and compact arrangement.

In order to form the polycrystalline silicon layer in the inducing layer to form a integrated semiconductor layer, the upper surfaces of any standing walls of the recess set in the inducing layer are flush with the upper surface of the inducing layer, thus the upper surface of the polycrystalline silicon layer 32 formed in the recess is flush with the upper surface of the inducing layer 31. Accordingly, the polycrystalline silicon layer 32 and the inducing layer 31 form an integrated semiconductor layer together. For instance, referring to FIG. 3, the polycrystalline silicon layer 32 and the inducing layer 31 have the same thickness, the semiconductor layer composed of the polycrystalline silicon layer 32 and the inducing layer 31 has a thickness of 100 nm-200 nm.

M4: a gate insulating layer, a gate, a passivation layer and a source and a drain connecting to the semiconductor layer are form sequentially on the semiconductor layer.

In this step, the step of forming a gate insulating layer, a gate, a passivation layer and a source and a drain connecting to the semiconductor layer sequentially on the semiconductor layer comprises: forming a gate insulating layer and a gate metal layer on the semiconductor layer sequentially, forming pattern of the gate in the gate metal layer by a patterning process; forming a passivation layer on the gate insulating layer and the gate, and forming through holes of the source/drain on the gate insulating layer and the passivation layer by a patterning process; forming a source and the drain metal layer on the passivation layer; and photoetching the source and the drain metal layer by a patterning process so as to form the source and the drain. The source and drain pass through the gate insulating layer and the passivation layer and connect with the semiconductor layer via the through holes, thus obtaining the corresponding thin film transistor.

For instance, according to another embodiment of the invention, the step M1: depositing an inducing layer on a substrate can also be: depositing dense silicon nitride thin film sub-layers and sparse silicon nitride thin film sub-layers alternatively so as to form the inducing layer 40.

Figure 4:
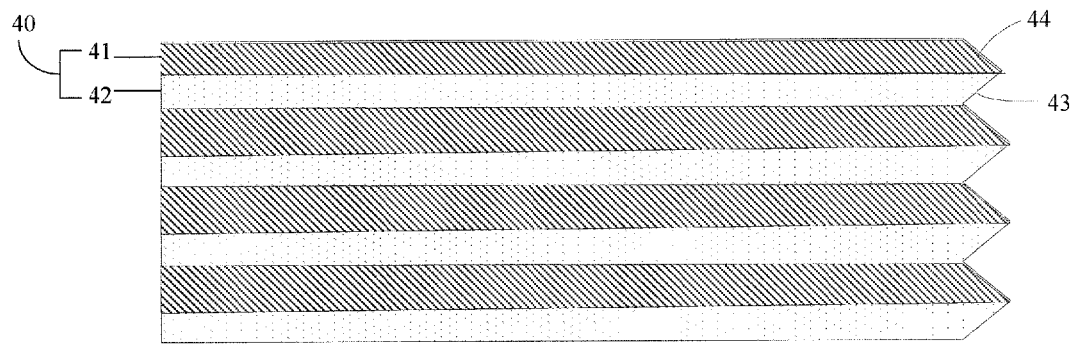
FIG. 4 is a schematic view of an edge of the serrated recess in the semiconductor layer of the thin film transistor according to an embodiment of the invention.

Referring to FIG. 4, the silicon nitride thin film sub-layers are deposited on the substrate by plasma chemistry vapor deposition process layer by layer. The silicon nitride thin film sub-layers deposited alternatively each has different density, that is the dense silicon nitride thin film layer 41 and sparse silicon nitride thin film sub-layer 42. The inducing layer 40 can comprise odd number of silicon nitride thin film layers composed of dense silicon nitride thin film sub-layers 41 and sparse silicon nitride thin film sub-layer 42, or even number of silicon nitride thin film layers composed of dense silicon nitride thin film sub-layer 41 and sparse silicon nitride thin film sub-layer 42.

Thus, the step M2: etching the recess in the inducing layer by the etching process with the edge of the recess having a prescribed shape can be: etching the inducing layer such that the dense inducing sub-layer and the sparse inducing sub-layer deposited alternatively form a plurality of serrated convex portions correspondingly.

The densities of the silicon nitride thin film layers are different. When etching the sparse silicon nitride thin film sub-layer, the etching speed is faster due to the low density of the sparse silicon nitride thin film, thus an inclined surface 43 extending inwards can be etched. On the contrary, while etching the dense silicon nitride thin film sub-layer, the etching speed is slower due to the high density of the dense silicon nitride thin film sub-layer, the inclined surface 44 extending outwards can be etched. In this way, by depositing the dense silicon nitride thin film sub-layers and the sparse silicon nitride thin film sub-layers alternatively, alternating inclined surfaces extending inwards or extending outwards are etched so as to form the serrated convex portions of the edge of the recess.

Embodiments of the invention provide a fabricating method a thin film transistor. In the thin film transistor fabricated by the method according to the embodiments of the invention, since the recess etched in the inducing layer deposited on the substrate has an edge of a prescribed shape, and the amorphous silicon layer is deposited in the recess with the prescribed shape, when the amorphous silicon in the recess with a prescribed shape is induced into the polycrystalline silicon by the crystallization method, the polycrystalline silicon grains are arranged inwards in the direction vertical to the edge of the recess, which can reduce the grain boundary defects significantly, thus improving the carrier mobility in the polycrystalline silicon. The method is simple and easy to implement, and the stability of the thin film transistor fabricated by this method is greatly improved.

Embodiments of the invention provide a thin film transistor fabricated by the method according to the embodiments of the invention.

Embodiments of the invention provide a thin film transistor, since the recess etched in the inducing layer deposited on the substrate has an edge of a prescribed shape, and the amorphous silicon layer is deposited in the recess with the prescribed shape, when the amorphous silicon in the recess with a prescribed shape is induced into the polycrystalline silicon by the crystallization method, the polycrystalline silicon grains are arranged inwards in the direction vertical to the edge of the recess, which can reduce the grain boundary defects significantly, thus improving carrier mobility in the polycrystalline silicon. The method is simple and easy to implement, and the stability of the thin film transistor fabricated by this method is greatly improved.

Embodiments of the invention provide a display panel comprising a thin film transistor according to the embodiments of the invention.

Embodiments of the invention provide a display panel comprising a thin film transistor fabricated by the method provided by the embodiments of the invention. Since the recess etched in the inducing layer deposited on the substrate has an edge of a prescribed shape, and the amorphous silicon layer is deposited in the recess with the prescribed shape, when the amorphous silicon in the recess with a prescribed shape is induced into the polycrystalline silicon by the crystallization method, the polycrystalline silicon grains are arranged inwards in the direction vertical to the edge of the recess, which can reduce the grain boundary defects significantly, thus improving carrier mobility in the polycrystalline silicon. The method is simple and easy to implement, and the stability of the thin film transistor fabricated by this method is greatly improved.

The forgoing embodiments are merely used to illustrate the invention, rather than limit the invention. Various modifications and variations can further be made by those ordinarily skilled in the related technical field without departing from the spirit and scope of the disclosure, and therefore, all equivalent technical solutions also fall within the scope of the disclosure. The protection scope of the disclosure is defined by the claims.

This application claims the priority of the Chinese patent application No. 201310745564.3 filed on Dec. 30, 2013, the contents of which are incorporated herein by reference in its entirety.

What is claimed is:

1. A fabricating method of a thin film transistor, comprising following steps:

M1, depositing an inducing layer on a substrate;

M2, etching a recess in the inducing layer by an etching process, the recess having an edge with a prescribed shape;

M3, depositing an amorphous silicon layer in the recess having an edge with a prescribed shape, and inducing the amorphous silicon layer to form a polycrystalline silicon layer by crystallization method, polycrystalline silicon grains in the polycrystalline silicon layer arranging in a direction vertical to the edge of the recess by the limitation of the edge of the recess, and the polycrystalline silicon layer and the inducing layer together forming a semiconductor layer; and M4, forming a gate insulating layer, a gate, a passivation layer and a source and a drain connecting with the semiconductor layer sequentially on the semiconductor layer.

2. The fabricating method according to claim 1, wherein the step M2 comprises:

etching a recess in the inducing layer by an etching process, and a plurality of convex portions are formed inwards in a direction vertical to the edge of the recess.

3. The fabricating method according to claim 2, wherein the plurality of convex portions are serrated.

4. The fabricating method according to claim 2, wherein the step M1 comprises:
depositing dense inducing sub-layer and sparse inducing sub-layer alternatively so as to form the inducing layer composed of the dense inducing sub-layer and the sparse inducing sub-layer on the substrate; and
the step M2 comprises:
etching the inducing layer so that the dense inducing sub-layer and the sparse inducing sub-layer deposited alternatively form a plurality of serrated convex portions correspondingly.

5. The fabricating method according to claim 1, wherein the inducing layer is made of a material of silicon nitride.

6. The fabricating method according to claim 1, wherein the polycrystalline silicon layer has an upper surface flush with an upper surface of the inducing layer.

7. The fabricating method according to claim 6, herein the semiconductor layer has a thickness of 100 nm-200 nm.

8. The fabricating method according to claim 1, wherein the step of forming a gate insulating layer, a gate, a passivation layer and a source and a drain connecting with the semiconductor layer sequentially on the semiconductor layer comprises:
forming a gate insulating layer and a gate metal layer on the semiconductor layer sequentially, forming pattern of the gate in the gate metal layer by a patterning process;
forming a passivation layer on the gate insulating layer and the gate, and forming through holes for the source and the drain on the gate insulating layer and the passivation layer by a patterning process;
forming a source/drain metal layer on the passivation layer, and photoetching the source/drain metal layer by a patterning process so as to form the source and the drain, the source and drain connect with the semiconductor layer via through holes passing through the gate insulating layer and the passivation layer.

9. A thin film transistor fabricated by a method comprising following steps:
M1, depositing an inducing layer on a substrate;
M2, etching a recess in the inducing layer by an etching process, the recess having an edge with a prescribed shape;
M3, depositing an amorphous silicon layer in the recess having an edge with a prescribed shape, and inducing the amorphous silicon layer to form a polycrystalline silicon layer by crystallization method, polycrystalline silicon grains in the polycrystalline silicon layer arranging in a direction vertical to the edge of the recess by the limitation of the of the recess, and the polycrystalline silicon layer and the inducing layer together forming a semiconductor layer; and
M4, forming a gate insulating layer, a gate, a passivation layer and a source and a drain connecting with the semiconductor layer sequentially on the semiconductor layer.

10. The thin film transistor according to claim 9, wherein a plurality of convex portions are formed inwards in a direction vertical to the edge of the recess.

11. The thin film transistor according to claim 9, wherein the inducing layer is made of a material of silicon nitride.

12. The thin film transistor according to claim 9, wherein the polycrystalline silicon layer has an upper surface flush with an upper surface of the inducing layer.

13. The thin film transistor according to claim 12, wherein the semiconductor layer has a thickness of 100 nm-200 nm.

14. A display panel comprising a thin film transistor fabricated by a method comprising following steps:
M1, depositing an inducing layer on a substrate;
M2, etching a recess in the inducing layer by an etching process, the recess having an edge with a prescribed shape;
M3, depositing an amorphous silicon layer in the recess having an edge with a prescribed shape, and inducing the amorphous silicon layer to form a polycrystalline silicon layer by crystallization method, polycrystalline silicon grains in the polycrystalline silicon layer arranging in a direction vertical to the edge of the recess by the limitation of the edge of the recess, and the polycrystalline silicon layer and the inducing layer together forming a semiconductor layer; and
M4, forming a gate insulating layer, a gate, passivation layer and a source and a drain connecting with the semiconductor layer sequentially on the semiconductor layer.

15. The thin film transistor according to claim 14, wherein the plurality of convex portions are serrated.

16. The display panel according to claim 14, wherein a plurality of convex portions are formed inwards in a direction vertical to the edge of the recess.

17. The display panel according to claim 16, wherein the plurality of convex portions are serrated.

18. The display panel according to claim 14, wherein the inducing layer is made of a material of silicon nitride.

19. The display panel according to claim 14, wherein the polycrystalline silicon layer has an upper surface flush with an upper surface of the inducing layer.

20. The display panel according to claim 19, wherein the semiconductor layer has a thickness of 100 nm-200 nm.

* * * * *